(12) United States Patent
Tanaka et al.

(10) Patent No.: US 6,770,109 B2
(45) Date of Patent: Aug. 3, 2004

(54) SUBSTRATE TRANSPORT CONTAINER

(75) Inventors: Akira Tanaka, Yamato (JP); Kazuo Okubo, Yokohama (JP); Yoko Suzuki, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/094,615

(22) Filed: Mar. 12, 2002

(65) Prior Publication Data
US 2002/0129707 A1 Sep. 19, 2002

Related U.S. Application Data

(62) Division of application No. 09/611,669, filed on Jul. 6, 2000, now Pat. No. 6,364,922.

(30) Foreign Application Priority Data

| Jul. 6, 1999 | (JP) | ............................................ 11-192322 |
| Jun. 30, 2000 | (JP) | ...................................... 2000-199520 |

(51) Int. Cl.$^7$ .......................... B65D 85/00; B65D 85/38
(52) U.S. Cl. ...................... 55/385.6; 55/385.1; 55/418; 55/471; 206/710; 206/711; 454/187; 454/192
(58) Field of Search .............................. 55/385.1, 385.2, 55/385.6, 418, 471; 206/710, 711; 454/187, 192

(56) References Cited

U.S. PATENT DOCUMENTS

| 4,471,716 A | * | 9/1984 | Milliren ...................... 118/500 |
| 5,207,548 A | * | 5/1993 | Suffel ......................... 414/404 |
| 5,255,797 A | * | 10/1993 | Kos ............................ 206/711 |
| 5,346,518 A | * | 9/1994 | Baseman et al. ........... 55/385.1 |
| 5,749,469 A | * | 5/1998 | Williams .................... 206/710 |
| 5,893,939 A | * | 4/1999 | Rakocy et al. ................ 55/471 |
| 5,984,991 A | * | 11/1999 | Glucksman .................... 55/471 |
| 6,001,145 A | * | 12/1999 | Hammes ...................... 55/471 |
| 6,471,736 B2 | * | 10/2002 | Campbell et al. ............. 55/471 |

FOREIGN PATENT DOCUMENTS

| JP | 06318631 A | * | 11/1994 |
| JP | 07283092 | * | 10/1995 |
| JP | 08148551 A | * | 6/1996 |

* cited by examiner

*Primary Examiner*—Minh-Chau T. Pham
(74) *Attorney, Agent, or Firm*—Oblon, Spivak, McClelland, Maier & Neustadt, P.C.

(57) ABSTRACT

A substrate transport container having a carrier box including a container body and a door hermetically sealably covering an opening provided in the front of the container body. Partitions form a circulating flow path in the carrier box. The circulating flow path has a flow path in which air flows toward substrates and a flow path in which air flows toward a fan. A substrate carrying section is disposed in the flow path in which air flows toward the substrates to carry the substrates in such a way that the principal surfaces of the substrates are approximately parallel to the flow path in which air flows toward the substrates. A particle removing filter and a gaseous impurity trapping filter are placed on the upstream side of the substrate carrying section in the flow path in which air flows toward the substrates. A fan motor for driving the fan is incorporated in the carrier box to form an air current for circulating through the circulating flow path.

9 Claims, 10 Drawing Sheets

SUBSTRATE TRANSPORT CONTAINER

This application is a Division of Ser. No. 09/611,669 filed Jul. 6, 2000 now U.S. Pat. No. 6,364,922.

BACKGROUND OF THE INVENTION

The present invention relates to a substrate transport container suitable for use in storing or transporting objects, e.g. semiconductor wafers, photomasks, or hard disks, in an atmosphere of extremely high cleanliness.

During transport or storage of substrates, e.g. semiconductor wafers or photomasks, produced in a semiconductor manufacturing factory, for example, if traces of dust or gaseous impurities present in the surrounding air adhere to the semiconductor wafers or other objects, the product yield is lowered. This tendency becomes increasingly remarkable as the degree of integration increases. In the field of magnetic disks also, recording has been becoming denser acceleratedly since the advent of magnetoresistive heads. Accordingly, there has been a demand for high cleanliness regarding not only dust but also gaseous impurities.

To produce a clean space for accommodating substrates when transported or stored, a clean box and so forth equipped with a fan motor, an HEPA (high efficiency particle air) filter and a ULPA (ultra low penetration air) filter have been developed. As a technique of locally cleaning the periphery of semiconductor wafers, for example, there is a method wherein the atmosphere in a clean box accommodating semiconductor wafers is replaced with high-purity nitrogen to maintain cleanliness and to suppress the growth of a native oxide film.

However, the clean box using an HEPA filter and a ULPA filter cannot remove traces of organic or inorganic gases although it is capable of removing particulate contaminants. Moreover, if a large amount of circulating air flows through a part that does not directly contribute to cleaning of objects being transported or stored, or if there is an area where the circulating air undesirably stays in the clean box, it is impossible to expect an improvement in the ventilation efficiency in the clean box. Consequently, the contamination preventing effect by the cleaned air deteriorates. With the method wherein the atmosphere in the clean box is replaced with high-purity nitrogen, it is impossible to remove impurities generated from the component parts in the container and the semiconductor wafers themselves. In addition, the use of nitrogen involves a problem in terms of safety.

Also, in the semiconductor manufacturing industry, silicon wafers are rapidly increasing in diameter, and circuit patterns formed thereon are becoming increasingly small and fine. As the diameter of wafers increases, the size and weight of a container used to transport them also increase. Consequently, it is becoming difficult to handle wafer transport containers by manual operation. In addition, as integrated circuits become smaller and finer, it is necessary to isolate wafers from human beings as the main source of contamination in the semiconductor manufacturing factory. That is, it is essential to transport wafers using a machine and to open and close the transport container door mechanically.

SUMMARY OF THE INVENTION

In view of the above-described problems, an object of the present invention is to provide a substrate transport container which is not only capable of efficiently preventing substrates accommodated therein from being contaminated by an ambient atmosphere but which is also capable of effectively preventing contamination of the substrates with contaminants generated from the substrates themselves and the component parts in the container, and which allows an automated operation in the factory.

According to a first aspect of the present invention, there is provided a substrate transport container having a carrier box including a container body and a door hermetically sealably covering an opening provided in the front of the container body. Partitions are provided to form a circulating flow path in the carrier box. The circulating flow path has a flow path in which air flows toward substrates and a flow path in which air flows toward a fan. A substrate carrying section is disposed in the flow path in which air flows toward the substrates to carry the substrates in such a way that the principal surfaces of the substrates are approximately parallel to the flow path in which air flows toward the substrates. A particle removing filter and a gaseous impurity trapping filter are placed on the upstream side of the substrate carrying section in the flow path in which air flows toward the substrates. A fan motor is incorporated in the carrier box to form an air current which circulates through the circulating flow path.

Thus, a circulating air current is formed in the carrier box, and the circulating air is sent to the substrate carrying section after being cleaned physically and chemically through the particle removing filter and the gaseous impurity trapping filter. Accordingly, even if the container contains particles likely to adhere to the inner walls of the container or the substrates or contains contaminants source such as gases generated from the container, the particles or gases are prevented from contaminating the substrates held in the substrate carrying section. In addition, because the wafer loading/unloading door is located on the downstream side of the substrate carrying section, the substrates are prevented from being contaminated through the container portions, which is likely to be contaminated when the door is opened or closed.

SEMI (Semiconductor Equipment and Materials International) Standards are known as international standards relating to semiconductor manufacturing equipment and materials. The SEMI Standards specify items relating to the standard interfaces of transport containers for 200-mm wafers, 300-mm wafers and so forth. The structure having an opening provided in a side of the container body is adapted to the front-opening interface specified for 300-mm wafer transport containers.

As a membrane material for the gaseous impurity trapping filter, it is possible to use, for example, ion-exchange nonwoven fabric or fiber, activated carbon fiber, granular activated carbon, pulverized activated carbon, or granular silicon singly or in combination, or an integrated material obtained by laminating these materials. Ammonia and other ions present in the air and ionic substances contained in mist, e.g. hydrofluoric acid and hydrochloric acid, can be efficiently adsorbed and thus removed by ion-exchange nonwoven fabric or fiber and activated carbon fiber obtained by carbonizing and activating cellulosic fiber, acrylic fiber and lignin fiber. Ion-exchange nonwoven fabric or fiber produced by radiation-induced graft polymerization reaction can be used.

According to a second aspect of the present invention, there is provided a substrate transport container having
    a carrier box including a container body and a door hermetically sealably covering an opening provided in the bottom of the container body. Partitions are provided to form a circulating flow path in the carrier box.

The circulating flow path has a flow path in which air flows toward substrates and a flow path in which air flows toward a fan. A substrate carrying section is disposed in the flow path in which air flows toward the substrates to carry the substrates in such a way that the principal surfaces of the substrates are approximately parallel to the flow path in which air flows toward the substrates. A particle removing filter and a gaseous impurity trapping filter are placed on the upstream side of the substrate carrying section in the flow path in which air flows toward the substrates. A fan motor is incorporated in the carrier box to form an air current which circulates through the circulating flow path.

This substrate transport container differs from the substrate transport container according to the first aspect of the present invention in that a door is provided at the bottom of the container. This is because, in accordance with SEMI Standards, the standard mechanical interface of transport containers for wafers which is not larger than 200 millimeters in diameter has a structure in which the container bottom is opened and closed.

In the substrate transport containers according to the first and second aspects of the present invention, the door may have an automatic open-close latch mechanism. With this arrangement, when the substrate transport container is seated on a delivery station or the like that provides a place for delivery of substrates for the substrate transport container, the door is automatically opened, and thus delivery can be performed speedily.

According to a third aspect of the present invention, there is provided a combination of a substrate transport container according to the first or second aspect of the present invention and an automatic door opener for automatically opening and closing a wafer loading/unloading door of the substrate transport container. The automatic door opener has charging terminals for automatically charging a secondary battery of the substrate transport container when it is placed on the automatic door opener. As automation of semiconductor manufacturing factories advances, it will become necessary to automate the charging of a secondary battery as a power source for driving the fan motor. The substrate transport containers generally positioned at the automatic door opener for automatically opening and closing a wafer loading/unloading door of the substrate transport container for loading and unloading wafers into and from semiconductor manufacturing equipment. When the substrate transport container is placed on the automatic door opener, the secondary battery is automatically charged, thereby allowing the fan motor to be operated and controlled continuously for a long period of time without manual operation.

According to a fourth aspect of the present invention, there is provided a combination of a substrate transport container according to the first or second aspect of the present invention and a substrate transport container standby station, where a plurality of substrate transport containers according to the first or second aspect of the present invention can stand by and which has charging terminals for automatically starting charging when each of the substrate transport containers is seated in a standby position. Because the secondary battery as a power source for driving the fan motor has only a limited battery capacity, the fan motor cannot be operated in excess of several days. When a plurality of substrate transport containers are seated in predetermined positions, respectively, the secondary batteries mounted in the containers are automatically charged and controlled, thereby allowing the substrates to be stored for a long period of time without manual operation. The standby station also functions as substrate storage equipment.

According to a fifth aspect of the present invention, there is provided a method for maintaining cleanliness of substrates, wherein after the atmosphere in the substrate transport container according to the first or second aspect of the present invention has been replaced with dry air, clean air is circulated through the substrate transport container to provide ventilation. During storage of wafers, a native oxide film grows on the wafers from water and oxygen in the storage environment. After the wafers have been put in the substrate transport container, the air in the container is replaced with dry air to reduce the concentrations of water and oxygen to ultra-low levels. Consequently, it is possible to suppress the growth of a native oxide film. At the same time, it is possible to prevent adsorption of particulate contaminants and organic matter.

The above and other objects, features and advantages of the present invention will become more apparent from the following description of the preferred embodiments thereof, taken in conjunction with the accompanying drawings.

DESCRIPTION OF THE PREFERRED EMBODIMENTS

Figure 1:
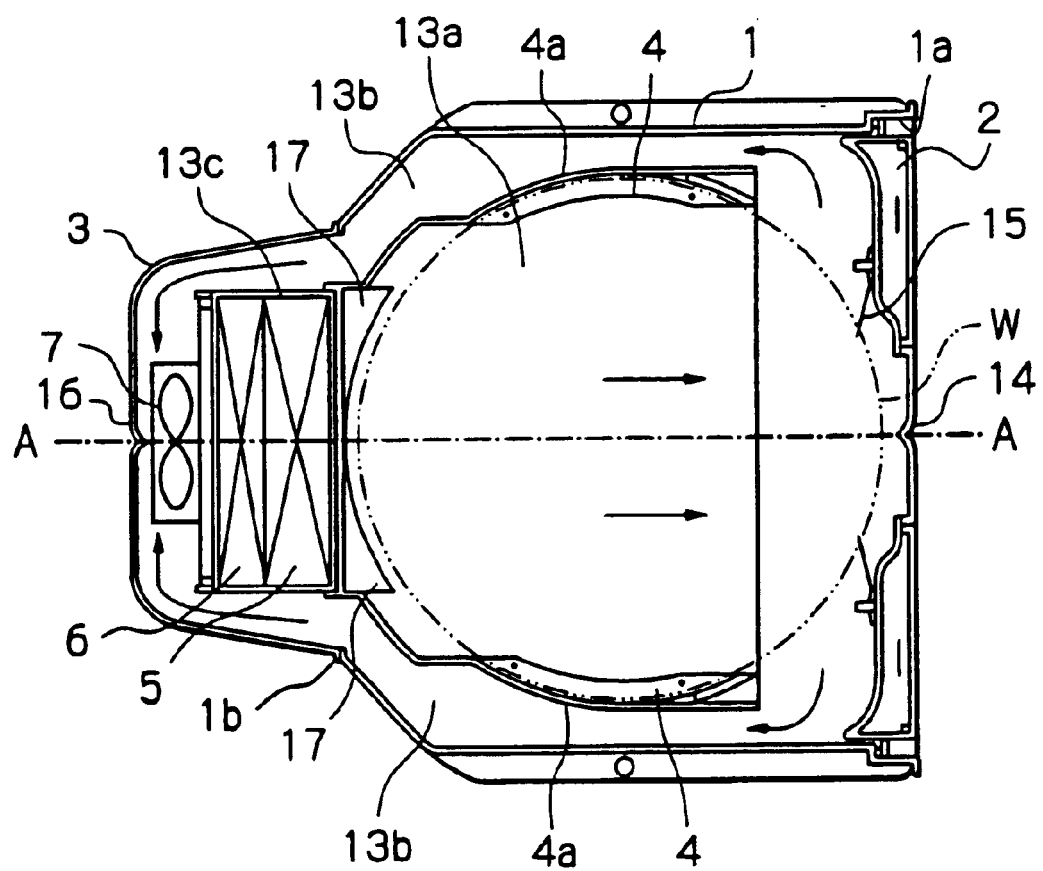
FIG. 1 is a sectional plan view showing an automation-compatible substrate transport container equipped with an air cleaner according to a first embodiment of the present invention.

Embodiments of the present invention will be described below in detail with reference to the accompanying drawings.

FIGS. 1 to 4 show an automation-compatible substrate transport container according to a first embodiment of the present invention. In the substrate transport container, a plurality of 300-mm wafers (substrates to be treated) W are accommodated in groove-shaped pockets disposed in the inside of a container body to transport or store them. The substrate transport container has a cuboid container body 1 and a wafer loading/unloading door 2 adapted to be coupled to an automatic door opener (explained later) for automatically opening and closing the wafer loading/unloading door 2. The wafer loading/unloading door 2 is capable of mechanically opening and closing an opening 1a provided in a side of the container body 1. A cover 3 is located at a side of the container body 1 remote from the opening 1a to cover an opening 1b for insertion and withdrawal of filters and a fan motor stated below. The substrate transport container further has groove-shaped pockets 4 for carrying wafers W, a ULPA filter 5, a chemical filter 6, and a fan motor 7. These members are closely connected to each other to form a carrier box of high hermeticity.

The wafer loading/unloading door 2 can be opened and closed mechanically. To this end, the bottom of the container body 1 is provided with V-grooves 9 (FIG. 4) for engagement with kinematic coupling pins 8 of an automatic door opener 32 (FIG. 5) to effect highly accurate positioning with respect to the automatic door opener. To allow the wafer loading/unloading door 2 to be automatically opened and closed by the automatic door opener 32, the wafer loading/unloading door 2 is provided with pin receiving portions 10 (FIG. 3) for receiving a positioning pin of the automatic door opener and keyways 11 into which latch keys of the door opener are inserted for opening and closing the wafer loading/unloading door 2. In addition, the substrate transport container has a robotic handling flange 12 so as to be capable of being transported by a transport device such as an OHT (Overhead Hoist Transport) or an AGV (Automatic Guided Vehicle). The V-grooves 9, the positioning pin receiving portions 10, the keyways 11, the robotic handling flange 12 and other matters relating to the automation interface are designed in conformity to SEMI Standards E1.9, E47.1, E57 and E62.

Figure 2:
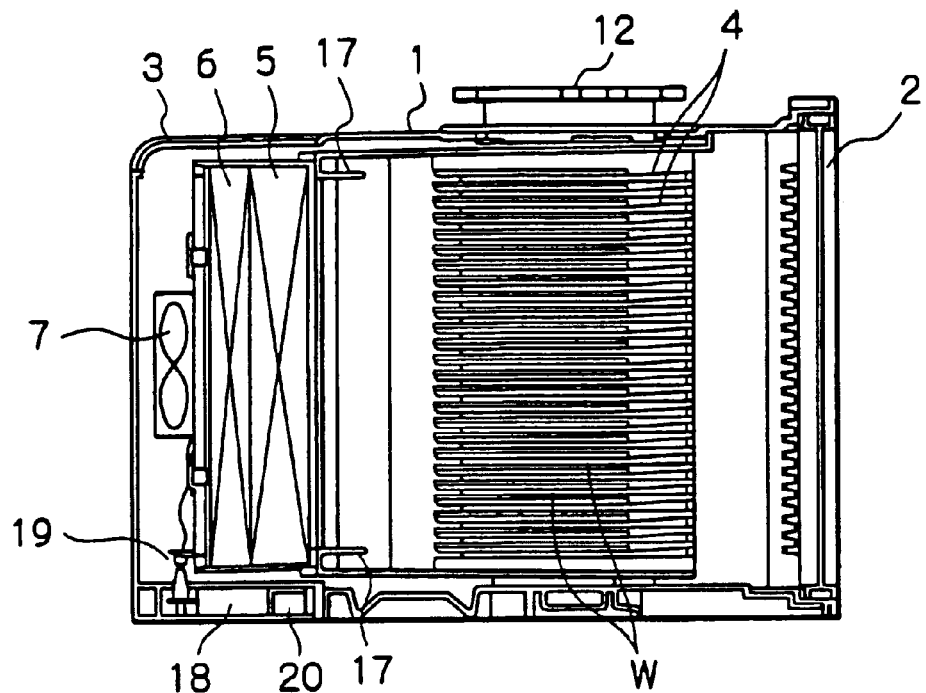
FIG. 2 is a sectional view taken along line A—A in FIG. 1.
Figure 3:
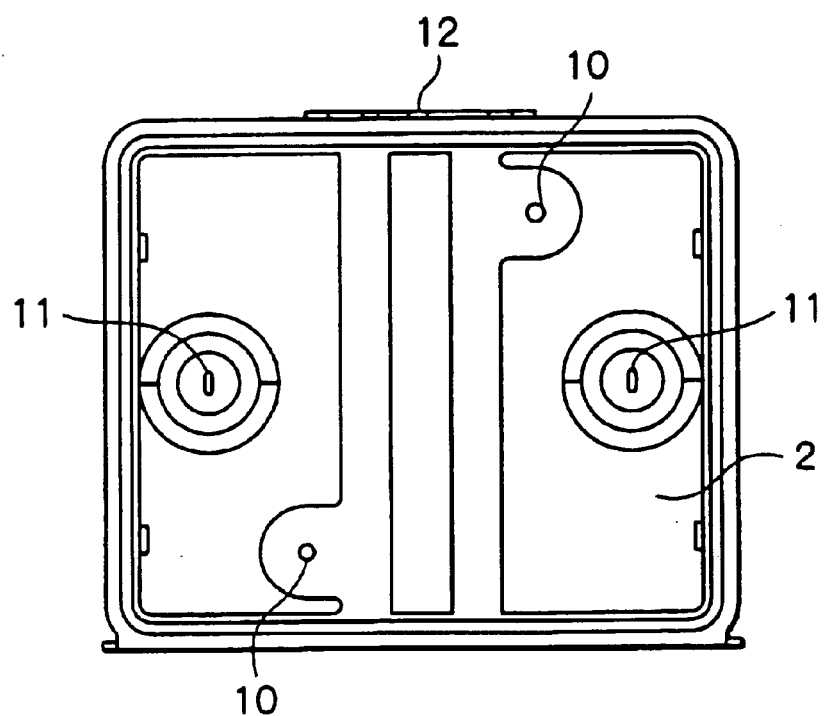
FIG. 3 is a front view showing the automation-compatible substrate transport container according to the first embodiment of the present invention.

The inside of the container body 1 is divided into a central chamber 13a in the center and a pair of side chambers 13b on both sides of the central chamber 13a by a pair of partitions (right and left) 4a, 4a integrated with groove-shaped pockets 4. The partitions 4a, 4a are disposed to face each other between the wafer loading/unloading door 2 and the cover 3 across respective gaps. The groove-shaped pockets 4 are integrally provided on the inner surface of the partitions 4a, 4a. Each groove-shaped pocket 4 has a tapered portion diverging toward the wafer loading/unloading door 2 so as to engage a wafer W. The groove-shaped pockets 4 integral with the partitions 4a, 4a may be positioned in and fixed to the container 1 as shown in FIGS. 1 and 2 after engaging wafers W therein.

A particle-removing filter 5 for mainly removing particles and a gaseous impurity trapping filter 6 for removing impurity gases are placed in a filter box 13c communicating with the central chamber 13a on the cover 3 side of the carrier box in such a manner that air can be passed from the cover 3 side toward the wafer loading/unloading door 2. Meanwhile, a fan motor 7 is provided on the upstream side of the chemical filter 6 to send air toward the wafer loading/unloading door 2.

Both end portions of the wafer loading/unloading door 2 are smoothly curved inwardly, and a triangular rectifying plate 14 is provided in the center of the wafer loading/unloading door 2 so as to guide an air flow smoothly as shown by an arrow. In addition, the wafer loading/unloading door 2 is equipped with locking members 15 for preventing displacement of wafers W. Similarly, the inner surface of the cover 3 is curved inwardly, and a triangular rectifying plate 16 is provided in the center thereof. Further, rectifying plates 17 for supplying clean air uniformly to a plurality of wafers W are installed inside the carrier box at two positions adjacent to a clean air outlet opening of the filter box 13c.

When 25 wafers W are accommodated in the groove-shaped pockets 4 of the carrier box, the gap between each of the 1st and the 25th wafers W and the carrier box is wider than the gap between each pair of adjacent wafers W. This prevents clean air from being supplied to the wafers W at a uniform flow rate. The flow rate in the gap between each of the 1st and 25th wafers W and the carrier box and the flow rate in the gap between each pair of adjacent wafers W can be made uniform at the air inlet to the wafers by providing the rectifying plates 17 at the clean air outlet opening of the filter box 13c. Thus, it becomes possible to perform efficient cleaning.

Figure 4:
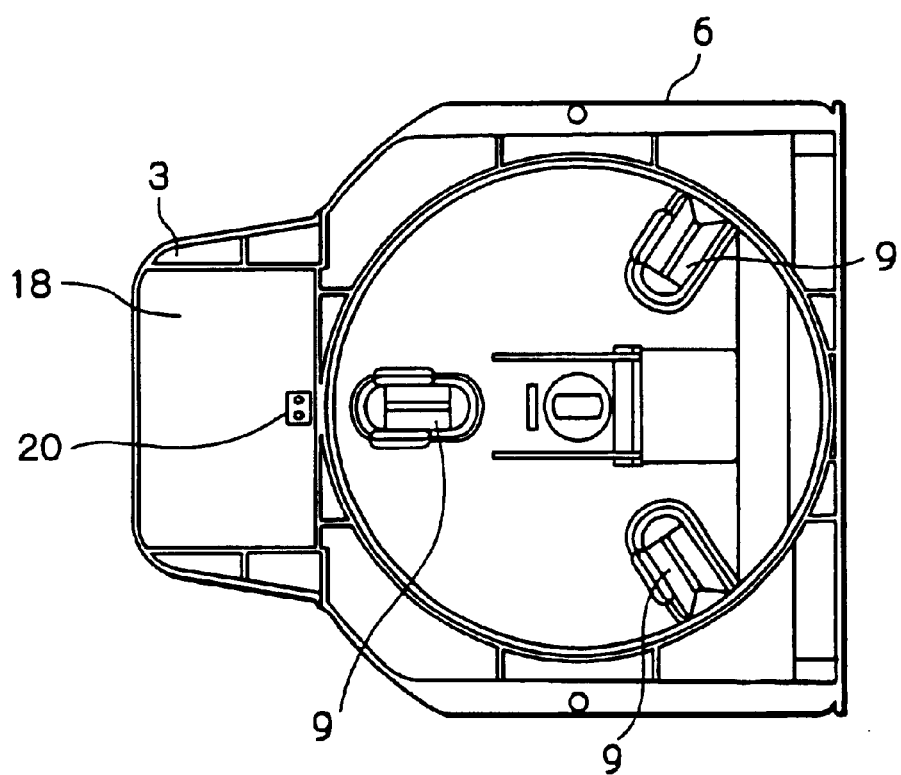
FIG. 4 is a bottom view showing the automation-compatible substrate transport container according to the first embodiment of the present invention.

A power supply unit 18 incorporating a secondary battery is provided in the bottom of the cover 3 (FIGS. 2, 4). The power supply unit 18 is provided with contacts connecting with terminals 19 of the fan motor 7. The power supply unit 18 incorporates an operation control board for the fan motor 7. The on-off timing of the fan motor 7 and the number of revolutions thereof are controlled along a control program previously input to the control board. In addition, the bottom of the power supply unit 18 is provided with charging terminals 20 so that when the substrate transport container is seated on the automatic door opener or a charging station, the charging terminals 20 are connected to terminals provided on the door opener or the station, thereby allowing the secondary battery to be charged automatically.

In this embodiment, the gaseous impurity trapping filter 6 is formed by wrapping granular activated carbon for removal of organic matter in an ion-exchange nonwoven fabric for removal of inorganic ions. As a medium, however, it is also possible to use pulverized activated carbon, activated carbon fiber, high-purity silicon, zeolite, ceramics, impregnated activated carbon and so forth. Activated carbon fiber can be obtained by forming carbon in the shape of fiber using rayon, Kynol, polyacrylonitrile, petroleum, or petroleum pitch as a raw material and subjecting the fibriform carbon to gasification, i.e. activation, at a high temperature not lower than 800° C. with steam, carbon dioxide gas or the like. To activated carbon fiber, a binder or the like that does not contribute to adsorption may be added for the purpose of maintaining the required strength, and preventing generation of dust. It is, however, desirable that the binder content be small from the viewpoint of material usage.

Activated carbon has a large number of pores between the fundamental crystals because unorganized carbon and so forth are removed in the process of activation. With the pores and the large specific surface area thereof, activated carbon has strong physical adsorptivity. Making use of this property, activated carbon filters filled with granular activated carbon are commercially available. Other commercially available filters include those using, as an air filter membrane material, activated carbon fiber, which generates a minimal amount of dust, provides good processability and has smaller pores and a larger specific surface area than granular activated carbon, and those having granular activated carbon with a diameter of about 0.5 millimeters carried on a urethane foam having an open-porous structure as an air filter membrane material.

High-purity silicon, which is the same material as the semiconductor substrate, is also usable as an adsorbent. There are two different surface conditions of high-purity silicon, i.e. a hydrophilic surface and a hydrophobic surface, which are different in adsorptive characteristics. In general, a hydrophobic surface cleaned with dilute hydrofluoric acid is more sensitive to environments and exhibits high adsorptive characteristics with respect to hydrocarbons even at an extremely low concentration. However, the hydrophobic surface of silicon changes to a hydrophilic surface when an oxide film is grown thereon. Therefore, the hydrophobic surface has a disadvantage in that the adsorptive characteristics change with time. The hydrophilic surface effectively adsorbs organic substances having a polarity, e.g. BHT (2,6-di-t-butyl-p-cresol) and DBP (dibutyl phthalate). In either case, it is not desirable to use high-purity silicon singly. The use of high-purity silicon in combination with activated carbon is effective.

Meanwhile, ion-exchange nonwoven fabric or fiber can be obtained by introducing an ion-exchange group by radiation-induced graft polymerization reaction, for example. More specifically, a base material consisting essentially of an organic polymer, e.g. a fiber or woven fabric of a polymer such as polyethylene or polypropylene or a natural polymer such as cotton or wool, is first irradiated with radiation, e.g. electron radiation or gamma radiation, to generate many active points. The active points have very high reactivity and are known as "radical". Chemically bonding a monomer to the radical allows the base material to be endowed with the property of the monomer, which is different from the property of the base material.

This technique is called "graft polymerization" because a monomer is grafted onto the base material. If a monomer having a sulfon group, a carboxyl group, an amino group or the like, which is an ion-exchange group, e.g. sodium styrene sulfonate, acrylic acid, or arylamine, is bonded to a base material of nonwoven polyethylene fabric by radiation-induced graft polymerization, it is possible to obtain a nonwoven ion exchanger markedly higher in ion-exchange rate than ion-exchange beads, generally known as "ion-exchange resin".

Similarly, an ion exchanger can be obtained by introducing an ion-exchange group into a base material after a monomer capable of introducing an ion-exchange group, e.g. styrene, chrolomethyl styrene, glycidyl methacrylate, acrylonitrile, or acrolein, has been grafted onto the base material by radiation-induced graft polymerization. In this way also, an ion exchanger retaining the original shape of the base material can be obtained.

Conventionally, glass fiber has been used as a filtering medium of ULPA filters and HEPA filters. However, it has become clear that glass fiber reacts with hydrogen fluoride (HF) vapor used in a semiconductor device manufacturing process and produces $BF_3$, which gives rise to a problem. Recently, ULPA and HEPA filters using PTFE (polytetrafluoroethylene), which is free from impurities such as boron and metals and unaffected by acids, alkalis, or organic solvents, as a filtering material have been made commercially available. In this embodiment, either glass fiber or PTFE should be used properly according to need.

Figure 5:
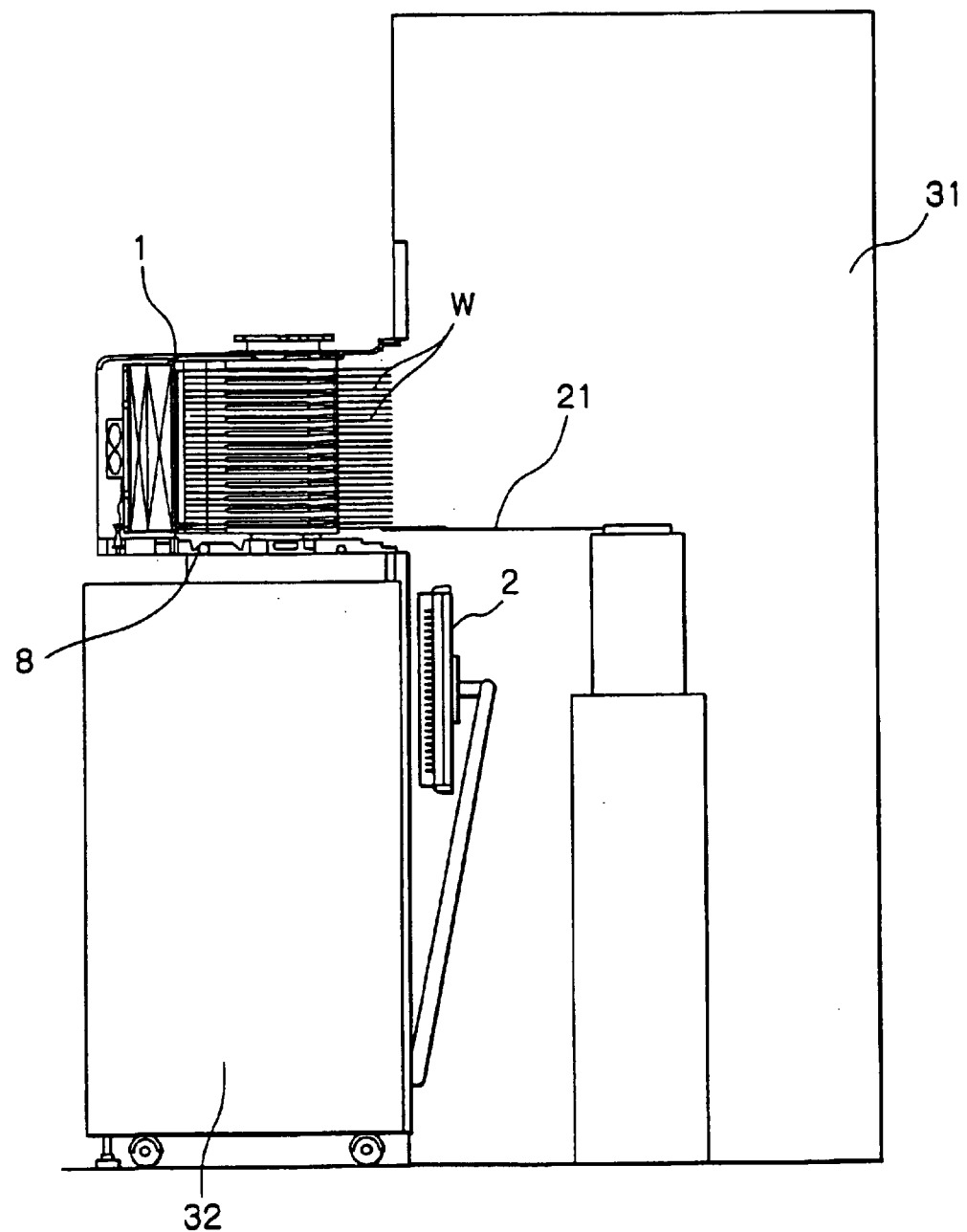
FIG. 5 is a schematic view showing the connection of the automation-compatible substrate transport container according to the first embodiment, shown in FIG. 1, with an automatic door opener for automatically opening and closing a wafer loading/unloading door

The operation of the automation-compatible substrate transport container arranged as stated above will be described below. FIG. 5 illustrates the operation of the substrate transport container according to the first embodiment of the present invention. The substrate transport container 1 incorporating the power supply for driving the fan motor, etc., which have previously been cleaned, is placed on an automatic door opener 32 installed in a semiconductor manufacturing system 31, and the wafer loading/unloading door 2 is opened by an operation performed by the automatic door opener 32. Thereafter, wafers W are sequentially unloaded by a wafer-handling robot 21, which is provided in the system 31, and subjected to processing. Upon completion of the processing, each wafer W is put in the substrate transport container 1. From the time when the wafer loading/unloading door 2 has been closed by the automatic door opener 32, the operation of the fan motor 7 is started to clean the air in the substrate transport container 1. After the wafer loading/unloading door 2 has been closed, the substrate transport container 1 is transported to the subsequent processing system or storage equipment by an OHT, AGV or the like.

The fan motor 7 is operated according to a preset program. The operation of the fan motor 7 produces a flow of air from the fan motor 7 through the gaseous impurity trapping filter 6 and the ULPA filter 5 to the central chamber 13a housing the wafers W therein. The air flowing out of the central chamber 13a is branched into two currents smoothly by the rectifying plate 14 provided on the wafer loading/unloading door 2, thereby forming air circulating paths in which air returns to the fan motor 7 through the side chambers 13b, as shown by arrows.

The air is cleaned by passing through the gaseous impurity trapping filter 6 and the ULPA filter 5 and introduced into the gaps between the wafers W by the inlet rectifying plates 17 installed at the air inlet opening formed by the partitions 4a, 4a, which are integrated with the groove-shaped pockets 4. The inlet rectifying plates 17 thus provided prevent excessive air from flowing through the gap between the endmost wafer W and the carrier box. The air passing through the gaps between the wafers W flows along the rectifying plate 14 and the inner surface of the wafer loading/unloading door 2 to turn round and returns to the fan motor 7 through the side chambers 13b.

In this process, solid substances, e.g. particles, attached to various portions or gaseous substances produced from the solid substances are carried by the circulating air currents. The air is cleaned through the two different kinds of filters on the upstream side of the wafers W before flowing along the wafers W. Accordingly, it is possible to prevent not only external contamination but also self-contamination, i.e. contamination with substances present in the container.

An operating pattern for the fan motor 7 may be selected appropriately according to the use conditions of the automation-compatible substrate transport container. In general, in the early stages of operation, the fan motor 7 is operated continuously or at an increased flow velocity to positively remove contaminants carried into the container. After a certain period of time has elapsed, the flow velocity is reduced or the operation is performed intermittently to prevent contamination with substances generated from the accommodated wafers W and the component parts in the container. By doing so, electric power consumed by the fan motor 7 can be reduced, and consequently, the frequency of charging the secondary battery can be reduced.

When the width W, depth D and height H of the substrate transport container are set at 389.5 millimeters, 450 millimeters and 335 millimeters, respectively, and twenty-five 300-mm wafers are accommodated therein, the overall weight, including the wafers W, is about 10 kilograms. In this embodiment, the system is set to be able to send circulating air through the carrier box at a flow rate of 0.12 $m^3$/min by the operation of the fan motor 7 so that the velocity of air passing through the center of the gap between each pair of adjacent wafers W is 0.03 m/s. The flow rate of circulating air can be varied by changing the fan motor 7.

Figure 6:
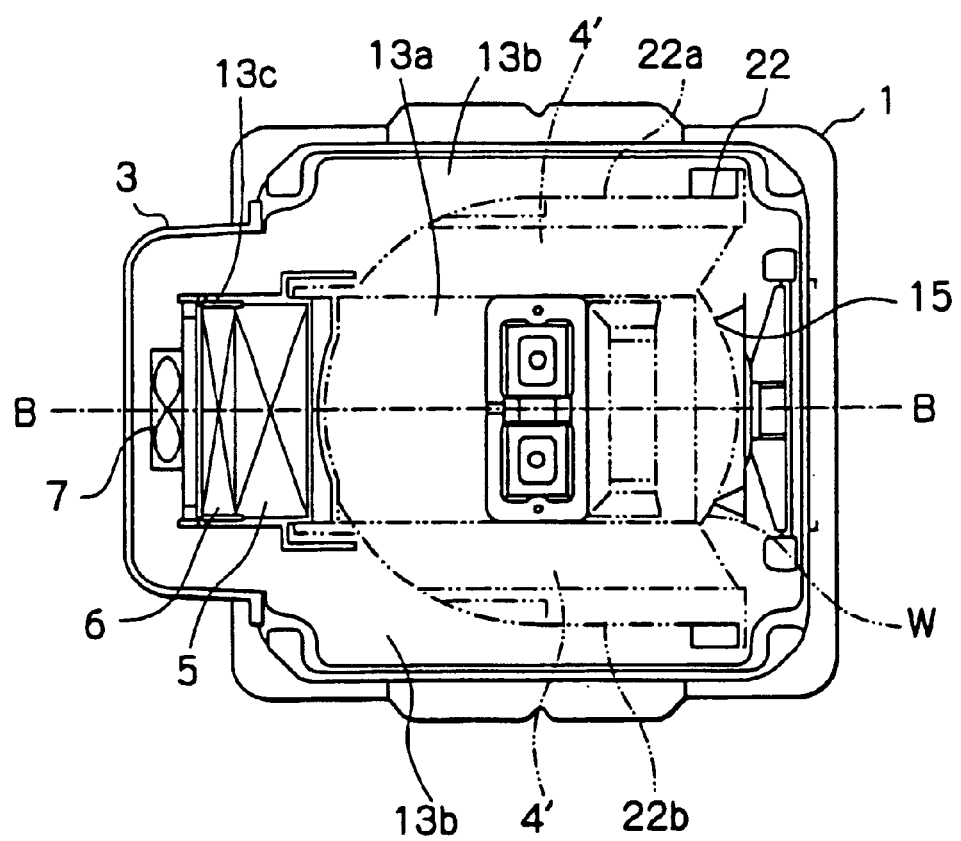
FIG. 6 is a sectional plan view showing a second embodiment of the present invention.
Figure 7:
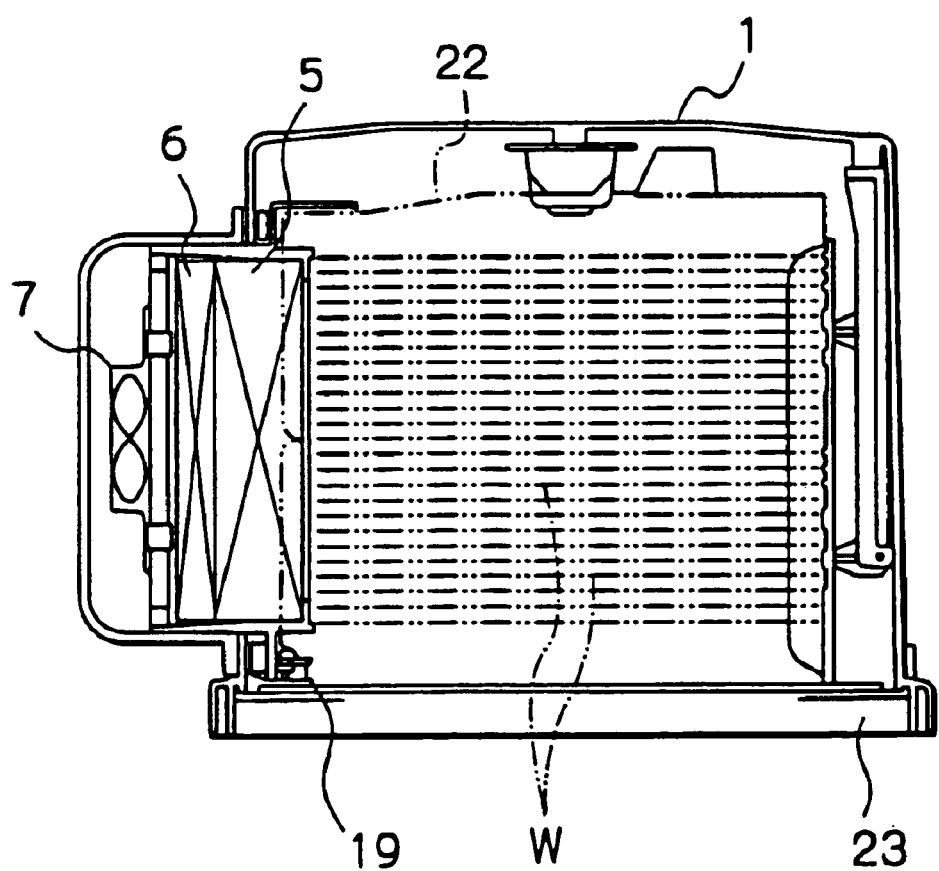
FIG. 7 is a sectional view taken along line B—B in FIG. 6.

FIGS. 6 and 7 show a second embodiment of the present invention. This embodiment differs from the first embodiment in that the size of wafers W is 200 millimeters, and a door 23 for automation interface is located in the bottom of the container 1. Wafers W that are accommodated in a wafer carrier 22 are put in the substrate transport container. In this embodiment, side walls 22a, 22b of the wafer carrier 22, which are integrated with the groove-shaped pocket 4' constitute the pair of partitions which separate the control chamber 13a and the side chambers 13b. Alternatively, a pair of partitions may be provided in the container box, and the wafer carrier 22 may be disposed between the partitions. The wafer carrier 22 may be received in and took out of the substrate transport container 1 together with closing and opening of the wafer loading/unloading door 2. The method of cleaning air in the substrate transport container is the same as in the first embodiment. It should be noted that in the second embodiment a secondary battery for driving the fan motor 7 and a fan motor control circuit are incorporated in the box door 23.

When the width W, depth D and height H of the substrate transport container are set at 283 millimeters, 342 millimeters and 254 millimeters, respectively, and twenty-five 200-mm wafers are accommodated therein, the overall weight, including the wafers W and the wafer carrier 22, is about 6 kilograms. In this embodiment, the system is set to be able to send circulating air through the substrate transport container at a flow rate of 0.05 m$^3$/min by the operation of the fan motor 7 so that the velocity of air passing through the center of the gap between each pair of adjacent wafers W is 0.03 m/s.

Figure 8:
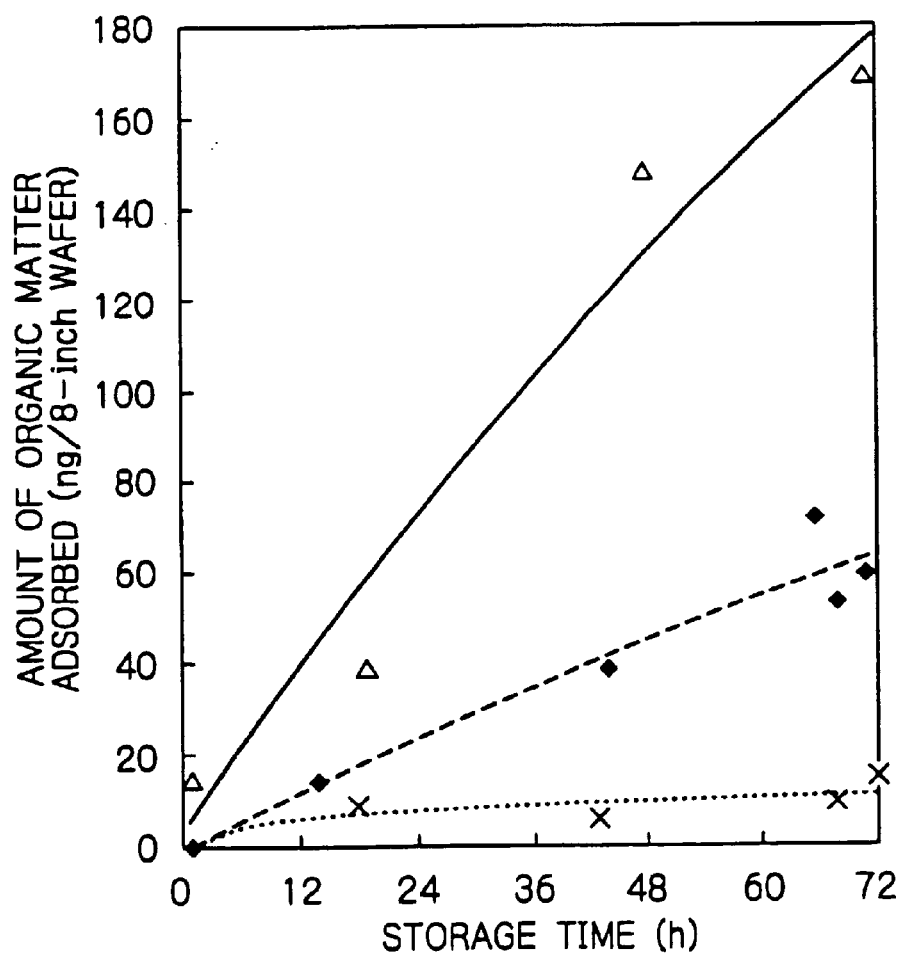
FIG. 8 is a graph showing the relationship between the storage time and the amount of organic matter adsorbed in the second embodiment of the present invention.

FIG. 8 shows the relationship between the storage time and the amount of organic matter adsorbed in the second embodiment. FIG. 8 shows experimental data obtained from wafers subjected to hydrophilic treatment and also shows data concerning a closed container generally used in semiconductor manufacturing factories for comparative purposes. Regarding the operation of the fan motor 7, two patterns are shown, i.e. a semi-continuous operation in which the cycle of ON for 30 seconds and OFF for 15 second is repeated and an intermittent operation in which the cycle of ON for 30 seconds and OFF for 225 seconds is repeated. It will be understood from FIG. 8 that the amount of organic matter adsorbed on the wafers W stored in the automation-compatible substrate transport container equipped with the air cleaner is lower than in the case of the closed container conventionally used. Regarding the organic matter adsorption characteristics, the amount of organic matter adsorbed can be maintained to be lower by an intermittent operation in which the ratio of the operating time to the suspension time is about 1:10 than by a semi-continuous operation.

Table 1 below shows the results of measurement of the concentrations of ionic substances according to the automation-compatible substrate transport container in the second embodiment. In the measurement, the fan motor 7 was operated continuously. Sampling was carried out by the impinger method for 70 hours. The sampling flow rate was 1/50 of the flow rate of air circulated through the automation-compatible substrate transport container, i.e. 1 l/min. The ionic substance concentrations were calculated by ion chromatograph. It will be understood from Table 1 that the concentrations of ionic substances in the automation-compatible substrate transport container equipped with the air cleaner can be reduced to below 0.1 μg/m$^3$.

TABLE 1

[units: μg/m$^3$]

| Conditions | $NH_4^+$ | $Cl^-$ | $NO_2^-$ | $NO_3^-$ | $SO_4^{2-}$ | $F^-$ |
|---|---|---|---|---|---|---|
| Substrate transport container | 0.01 | 0.01 | 0.07 | 0.05 | <0.01 | <0.01 |
| Test environment | 5.8 | 0.3 | 5.1 | 1.3 | 4.6 | 0.2 |

Figure 9:
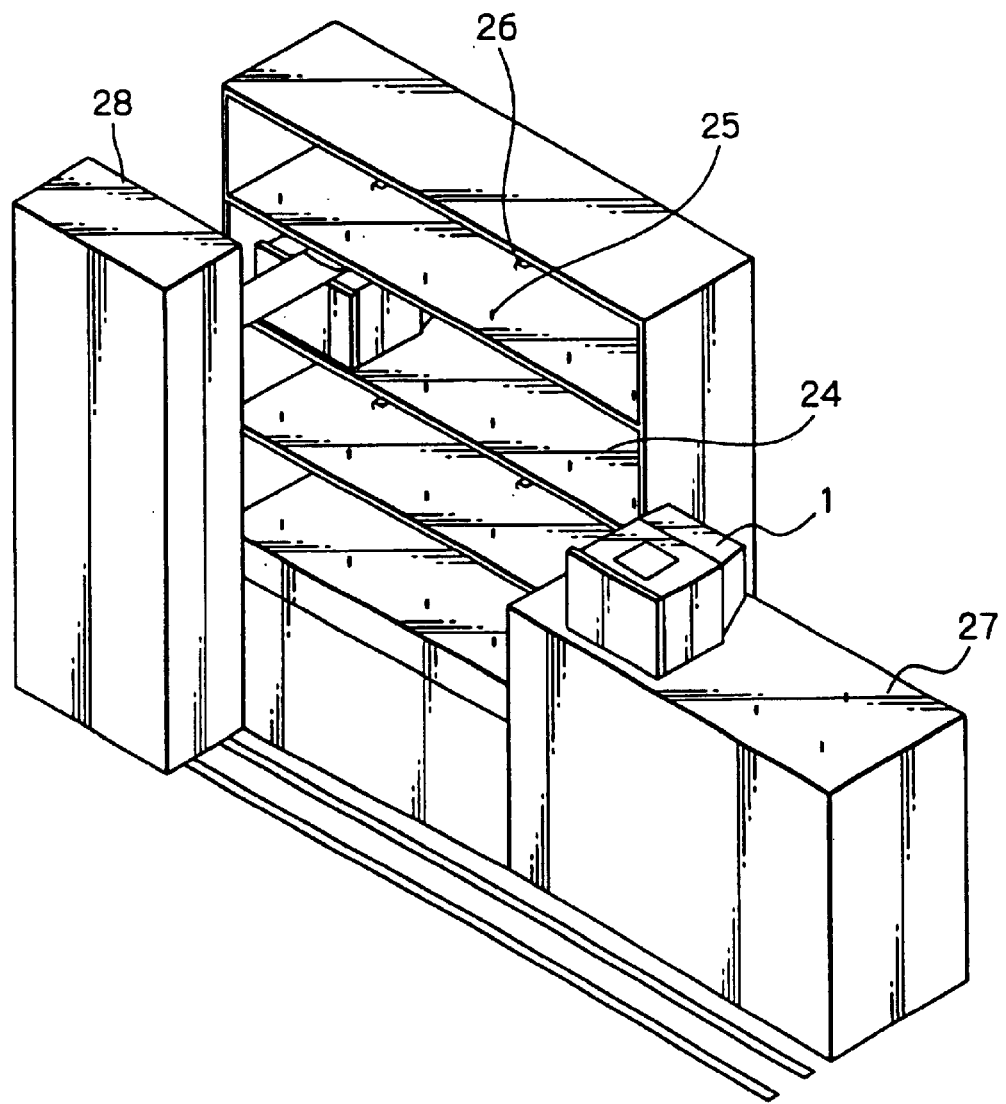
FIG. 9 is a schematic view showing a standby station for a plurality of automation-compatible substrate transport containers each equipped with an air cleaner according to the present invention.

FIG. 9 is a schematic view showing a substrate transport container standby station usable together with an automation-compatible substrate transport container according to the present invention. This is a storage shelf capable of collectively holding a plurality of automation-compatible substrate transport containers on standby. In this embodiment, the standby station will be described in regard to an automation-compatible substrate transport container for 300-mm wafers by way of example. An automation-compatible substrate transport container 1 is transported to a stand 27 for temporary storage of a substrate transport container by an AGV or an OHT. Thereafter, the substrate transport container 1 is moved to a shelf 24 by a special-purpose transport unit 28 and stored thereon. The shelf 24 has kinematic coupling pins 25 provided thereon at intervals of about 600 millimeters. When the substrate transport container 1 transported by the special-purpose transport unit 28 is engaged with the kinematic coupling pins 25 and thus seated in a predetermined position, charging terminals 26 provided on the shelf 24 contact the charging terminals 20 on the bottom of the substrate transport container 1. Thus, charging is automatically started. The standby station according to this embodiment allows the automation-compatible substrate transport container to store wafers for a long period of time and permits the substrate transport container to stand by in a state where it is ready to be transported at any time while the inside is kept clean. In addition, because the air cleaner is incorporated in the substrate transport container, it is not necessary to install the standby station in a highly clean environment.

Figure 10:
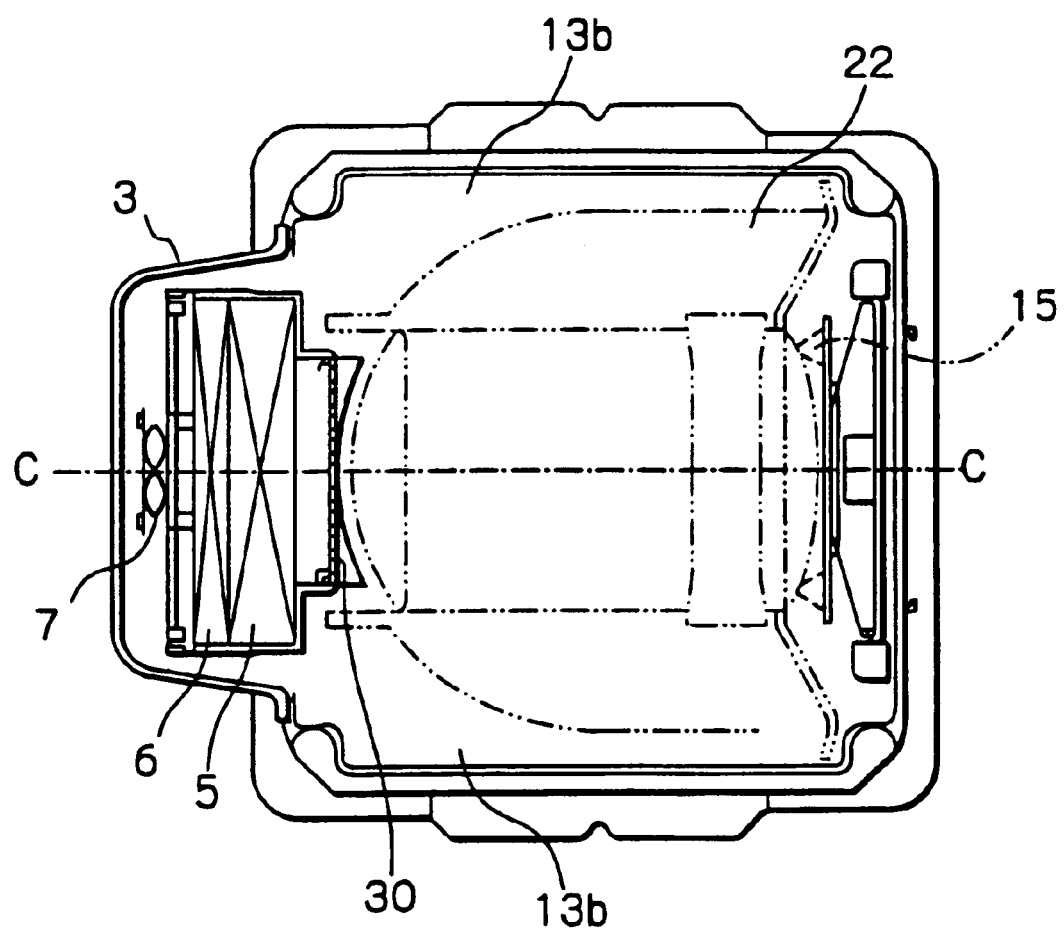
FIG. 10 is a sectional plan view showing a substrate transport container according to a fourth embodiment of the present invention.
Figure 11:
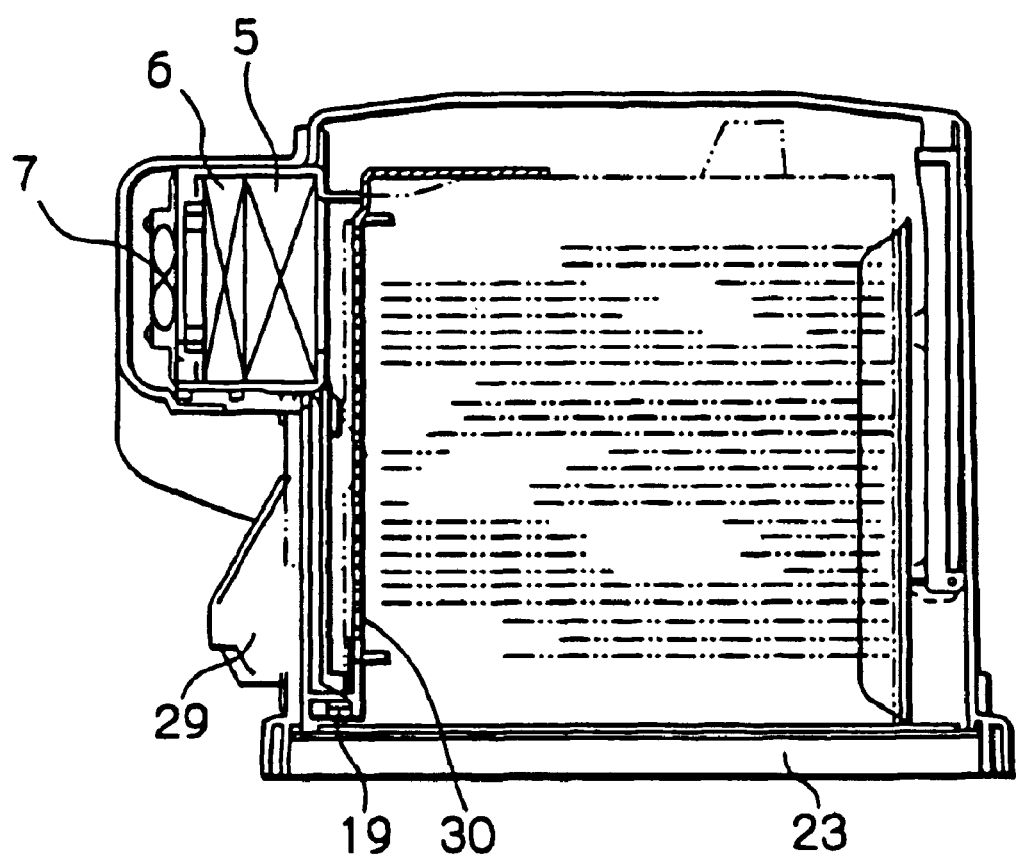
FIG. 11 is a sectional view taken along line C—C in FIG. 10.

FIGS. 10 and 11 show a fourth embodiment of the present invention. This embodiment is distinguished by further providing a storage device 29 for controlling the history of a substrate (or storing historical data of the substrate) and a punching plate 30 to the substrate transport container according to a second embodiment. In this embodiment, an air flow from a fan motor 7 is passed through a chemical filter 6 and a ULPA filter 5 and is, then, supplied to the wafers W after being uniformly distributed by a punching plate 30. The punching plate 30 is designed so as to have a different aperture rate or rate of hole area depending the portion thereof. That is, the upper portion of the punching plate which is positioned straightly downstream of the filters 5, 6 has a smaller aperture rate while the lower portion of the punching plate has a larger aperture rate. By this arrangement, a uniform air flow is created through the wafers despite its stack direction. The air flow after passing through the wafers flows along inner wall of the container and returns to the fan motor 7 to circulate through the substrate transport container to provide ventilation. It should be noted that this embodiment shows a preferred example of an automation-compatible substrate transport container, which is not intended to limit attachment of the storage device 29 to a specific position.

As has been stated above, according to the present invention, a circulating air current is formed in the carrier box, and the circulating air is sent to the substrate carrying section after being cleaned physically and chemically through the particle removing filter and the gaseous impurity trapping filter. Accordingly, it is possible to provide an automation-compatible substrate transport container that is not only capable of efficiently preventing the substrates accommodated therein from being contaminated by the ambient atmosphere but also capable of effectively preventing contamination of the substrates with contaminants generated from the substrates themselves. In addition, the interface with the load port, including the wafer loading/unloading door, and the robotic handling flange for handling by an OHT or an AGV conform to the SEMI Standards. Accordingly, it is possible to eliminate the need of a manual operation and hence possible to reduce the number of factors in the contamination of the substrates. Consequently, it is possible to contribute to improvements in production yield and quality of semiconductor wafers, photomasks and so forth, in which it is vital to avoid contamination by particulate and gaseous impurities. Moreover, charging of the secondary battery can be carried out automatically by combining the automation-compatible substrate transport container with an automatic door opener or a standby station, which are equipped with charging terminals for the substrate transport container. Accordingly, it is possible to contribute to the automation of the entire semiconductor manufacturing factory.

It should be noted that the present invention is not necessarily limited to the foregoing embodiments but can be modified in a variety of ways.

What is claimed is:

1. A system for transporting substrates comprising:
    a substrate transport container having a container body with an opening and a wafer loading/unloading door adapted to sealably cover the opening;
    a substrate carrying section disposed in the transport container;
    a fan attached to the container and configured to form a circulating flow toward said substrates in the transport container;
    a combination of a particle removing filter and a gaseous impurity trapping filter disposed upstream of said substrate carrying section in the circulating flow;
    a first charging terminal disposed outside of the transport container;
    a door opener configured to open and close the wafer loading/unloading door, the door opener having a second charging terminal; and
    positioning members adapted to position the transport container relative to the door opener such that the first and second charging terminals are connectable when the substrate transport container is placed on the door opener.

2. The system for transporting substrates according to claim 1, wherein a battery is provided in the transport container, the battery configured to be automatically charged when the first and second charging terminals are connected.

3. The system for transporting substrates according to claim 1, further comprising:
    a battery disposed in the transport container and in electrical connection with the first charging terminal.

4. The system for transporting substrates according to claim 1, wherein the positioning members comprise a groove and a pin adapted to cooperate with one another, the groove disposed on one of the substrate container and the door opener, and the pin disposed on the other of the door opener and the substrate container.

5. The system for transporting substrates according to claim 1, wherein the positioning members comprise a groove disposed on the substrate container and a pin disposed on the door opener.

6. The system for transporting substrates according to claim 5, where the groove comprises a V-shaped groove and the pin comprises a coupling pin.

7. The system for transporting substrates according to claim 1, wherein the positioning members comprise a plurality of grooves and a plurality of pins, the grooves disposed on one of the substrate container and the door opener, and the pins disposed on the other of the door opener and the substrate container.

8. The system for transporting substrates according to claim 7, wherein the plurality of grooves comprises 3 grooves, and the plurality of pins comprises 3 pins.

9. The system for transporting substrates according to claim 8, wherein the grooves are disposed on the substrate container, and the pins are disposed on the door opener.

* * * * *